US009240535B2

(12) United States Patent
Yoshida et al.

(10) Patent No.: US 9,240,535 B2
(45) Date of Patent: Jan. 19, 2016

(54) LIGHT-EMITTING-ELEMENT MOUNT SUBSTRATE AND LED DEVICE

(71) Applicant: MURATA MANUFACTURING CO., LTD., Kyoto (JP)

(72) Inventors: Kazuhiro Yoshida, Kyoto (JP); Teiji Yamamoto, Kyoto (JP); Akira Kumada, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 95 days.

(21) Appl. No.: 14/029,635

(22) Filed: Sep. 17, 2013

(65) Prior Publication Data

US 2014/0014986 A1    Jan. 16, 2014

Related U.S. Application Data

(63) Continuation of application No. PCT/JP2012/057121, filed on Mar. 21, 2012.

(30) Foreign Application Priority Data

Mar. 24, 2011   (JP) .................................. 2011-065970

(51) Int. Cl.
*H01L 33/62* (2010.01)
*H01L 27/15* (2006.01)
(Continued)

(52) U.S. Cl.
CPC .............. *H01L 33/62* (2013.01); *H01L 27/156* (2013.01); *H01L 25/167* (2013.01); *H01L 27/0248* (2013.01); *H01L 33/486* (2013.01); *H01L 2224/16* (2013.01); *H01L 2924/12032* (2013.01)

(58) Field of Classification Search
CPC ................................ H01L 27/15; H01L 33/62
USPC .................................................... 257/91, 99
See application file for complete search history.

(56) References Cited

U.S. PATENT DOCUMENTS 5,629,534 A * 5/1997 Inuzuka ................ H01L 31/173
                                                257/524
7,649,208 B2 * 1/2010 Lee ....................... H01L 25/167
                                                257/444
(Continued)

FOREIGN PATENT DOCUMENTS

CN    101079462 A    11/2007
CN    101908595 A    12/2010
(Continued)

OTHER PUBLICATIONS

International Searching Authority; PCT/JP2012/057121; May 1, 2012.
(Continued)

*Primary Examiner* — Matthew W Such
*Assistant Examiner* — Warren H Kilpatrick
(74) *Attorney, Agent, or Firm* — Studebaker & Brackett PC

(57) ABSTRACT

A light-emitting-element mount substrate formed by relatively simple manufacturing steps, having a good heat release property, and having a high mechanical strength; and an LED device including the light-emitting-element mount substrate are provided. A substrate body of a light-emitting-element mount substrate is made of a low-resistance semiconductor (e.g., n-type silicon) substrate, and is divided into a first and second individual substrate bodies by an insulating layer. A first front-surface mounting electrode and a first external-connection electrode are formed on respective first and second major surfaces (e.g., front and back surfaces) of the first individual substrate body. A second front-surface mounting electrode and a second external-connection electrode are formed respective first and second major surfaces (e.g., front and back surfaces) of the second individual substrate body. The insulating layer has a shape different from a straight-line shape in plan view.

16 Claims, 8 Drawing Sheets

(51) Int. Cl.
 *H01L 25/16* (2006.01)
 *H01L 33/48* (2010.01)
 *H01L 27/02* (2006.01)

(56) References Cited

U.S. PATENT DOCUMENTS

| | | | |
|---|---|---|---|
| 7,768,754 B2 * | 8/2010 | Collins, III | H01C 7/112 |
| | | | 257/100 |
| 7,883,910 B2 * | 2/2011 | Tsai | H01L 25/167 |
| | | | 257/98 |
| 2003/0057421 A1 | 3/2003 | Chen | |
| 2006/0138436 A1 | 6/2006 | Chen et al. | |
| 2006/0192084 A1 | 8/2006 | Lee et al. | |
| 2006/0220036 A1 | 10/2006 | Lee et al. | |
| 2007/0278483 A1 | 12/2007 | Narita | |
| 2007/0297108 A1 | 12/2007 | Collins, III et al. | |
| 2008/0006837 A1 * | 1/2008 | Park | H01L 33/486 |
| | | | 257/98 |
| 2009/0026472 A1 | 1/2009 | Yasuda et al. | |
| 2010/0193809 A1 | 8/2010 | Tsai et al. | |
| 2010/0193939 A1 | 8/2010 | Taguchi et al. | |

FOREIGN PATENT DOCUMENTS

| | | |
|---|---|---|
| JP | 11-251644 A | 9/1999 |
| JP | 2001-015815 A | 1/2001 |
| JP | 3217322 B2 | 10/2001 |
| JP | 3256951 B2 | 2/2002 |
| JP | 2003-197972 A | 7/2003 |
| JP | 3656316 B2 | 6/2005 |
| JP | 2005-210057 A | 8/2005 |
| JP | 2005-223016 A | 8/2005 |
| JP | 2006-190951 A | 7/2006 |
| JP | 2006-287188 A | 10/2006 |
| JP | 2008-034530 A | 2/2008 |
| JP | 2008-270327 A | 11/2008 |
| JP | 2010-182773 A | 8/2010 |
| JP | 2010-283267 A | 12/2010 |

OTHER PUBLICATIONS

The extended European search report issued by the European Patent Office on Oct. 14, 2014, which corresponds to European Patent Application No. 12760167.2-1551 and is related to U.S. Appl. No. 14/029,635.

"Notice on the First Office Action" issued by the State Intellectual Property Office of the People's Republic of China on Jun. 2, 2015, which corresponds to Chinese Patent Application No. 201280009530.1 and is related to U.S. Appl. No. 14/029,635; with English language translation.

* cited by examiner

LIGHT-EMITTING-ELEMENT MOUNT SUBSTRATE AND LED DEVICE

CROSS REFERENCE TO RELATED APPLICATIONS

The present application is a continuation of International Application No. PCT/JP2012/057121 filed on Mar. 21, 2012, and claims priority to Japanese Patent Application No. 2011-065970 filed on Mar. 24, 2011, the entire contents of each of these applications being incorporated herein by reference in their entirety.

TECHNICAL FIELD

The technical field relates to a light-emitting-element mount substrate for mounting a light emitting element on a surface of the mount substrate for installation, and an LED device including the light-emitting-element mount substrate.

BACKGROUND

Currently, various illumination devices using light emitting diodes (hereinafter, called LEDs) are being in practical use. In particular, LED devices that are mainly practically used today typically have the following structures. A configuration has a structure, in which three-color light emitting elements that emit light of colors being close to the three primary colors of light are installed on a single light-emitting-element mount substrate, and a front surface is covered with protection light-transmissive sealing resin. Also, another configuration has a structure, in which a blue or near-ultraviolet light emitting element is installed on a light-emitting-element mount substrate, and the light emitting element is covered with sealing resin containing a fluorescent substance or a phosphorescent substance.

With each of the structures, the light emitting element being an LED element is mounted on the light-emitting-element mount substrate and the light emitting element is covered with the resin. A configuration generally has one of structures shown in FIG. 1. FIGS. 1(A), 1(B), and 1(C) are side sectional views showing representative structure examples of conventional LED devices.

An LED device 10PA in FIG. 1(A) includes a light emitting element 900 and a light-emitting-element mount substrate 100PA. The light-emitting-element mount substrate 100PA includes a box-shaped substrate body 101PA having a recess formed of a bottom plate and side walls extending along the outer circumference of the bottom plate. The substrate body 101PA is made of insulating ceramic. Mounting electrodes 102P for mounting the light emitting element 900 are formed on a surface at a recess side of the bottom plate of the substrate body 101PA. External-connection electrodes 103P are formed on a surface at a side opposite to the recess side of the bottom plate of the substrate body 101PA. Via electrodes 104P are formed in the bottom plate of the substrate body 101PA. The via electrodes 104P electrically connect the mounting electrodes 102P with the external-connection electrodes 103P. The substrate body 101PA, the mounting electrodes 102P, the external-connection electrodes 103P, and the via electrodes 104P form the light-emitting-element mount substrate 100PA. The light emitting element 900 is arranged inside the recess of the substrate body 101PA and is mounted on the mounting electrodes 102P. The recess is filled with sealing resin 901. Hence, the light emitting element 900 is covered with the sealing resin 901.

An LED device 10PB in FIG. 1(B) includes a light emitting element 900 and a light-emitting-element mount substrate 100PB. The light-emitting-element mount substrate 100PB includes a flat-plate-shaped substrate body 101PB. Mounting electrodes 102P for mounting the light emitting element 900 are formed on a front surface of the substrate body 101PB. External-connection electrodes 103P are formed on a back surface of the substrate body 101PB. Via electrodes 104P are formed in the substrate body 101PB. The via electrodes 104P electrically connect the mounting electrodes 102P with the external-connection electrodes 103P. The substrate body 101PB, the mounting electrodes 102P, the external-connection electrodes 103P, and the via electrodes 104P form the light-emitting-element mount substrate 100PB. The light emitting element 900 is arranged on the front surface of the substrate body 101PB and is mounted on the mounting electrodes 102P. Sealing resin 901 is provided on a front surface of the light-emitting-element mount substrate 100PB so that the light emitting element 900 is covered with the sealing resin 901.

An LED device 10PC in FIG. 1(C) includes a light emitting element 900 and a light-emitting-element mount substrate 100PC. The light-emitting-element mount substrate 100PC includes a box-shaped substrate body 101PC having a recess formed of a bottom plate and side walls extending along the outer circumference of the bottom plate. The substrate body 101PC is made of heat-resisting resin. Mounting electrodes 102PC for mounting the light emitting element 900 are arranged on the bottom plate of the substrate body 101PC. The mounting electrodes 102PC are exposed from a surface at a recess side and a surface at a side opposite to the recess side. The substrate body 101PC and the mounting electrodes 102PC form the light-emitting-element mount substrate 100PC. The light emitting element 900 is arranged inside the recess of the substrate body 101PC and is mounted on the mounting electrodes 102PC. The recess is filled with sealing resin 901. Hence, the light emitting element 900 is covered with the sealing resin 901.

With each of the LED devices, heat generated by the light emitting element has to be efficiently released to an external circuit board. To attain this, in Japanese Unexamined Patent Application Publication No. 2003-197972 (Patent Document 1), a silicon semiconductor substrate or a metal substrate having a good heat release property is used for a substrate body of a light-emitting-diode mount substrate.

Also, to prevent electrostatic destruction of a light emitting element, there is an LED device including an ESD protection element. For example, in Japanese Unexamined Patent Application Publication No. 2001-15815 (Patent Document 2), a substrate body of a light-emitting-element mount substrate is formed of a semiconductor substrate, and an ESD protection element is formed in the semiconductor substrate. In the LED device descried in Patent Document 1, if a low-resistance silicon substrate is used for the substrate body of the light-emitting-element mount substrate, mounting electrodes, with which two terminals of a light emitting element are connected, have to be insulated. Hence, the low-resistance silicon substrate has to be electrically isolated in two regions. Hence, in Patent Document 1, an insulating layer for insulating and isolation is formed in a straight-line shape near a center portion of the low-resistance silicon substrate. To be more specific, for example, an insulating layer made of a silicon oxide layer is formed at the low-resistance silicon substrate.

SUMMARY

The present disclosure provides a light-emitting-element mount substrate formed by relatively simple manufacturing steps, having a good heat release property, and having a high mechanical strength, and provides an LED device including the light-emitting-element mount substrate.

In one aspect of the present disclosure, a light-emitting-element mount substrate that can used for connecting a light emitting element with an external circuit board includes a substrate body made of a low-resistance semiconductor substrate and an insulating layer, a first surface mounting electrode, a first external-connection electrode, a second surface mounting electrode, and a second external-connection electrode. The insulating layer divides the substrate body into a first semiconductor substrate body and a second semiconductor substrate body, which are insulated from each other. The first surface mounting electrode is provided on a first major surface (e.g., a front surface) of the first semiconductor substrate body. The first external-connection electrode is provided on a second major surface (e.g., a back surface) of the first semiconductor substrate body. The second surface mounting electrode is provided on a first major surface (e.g., a front surface) of the second semiconductor substrate body. The second external-connection electrode is provided on a second major surface (e.g., a back surface) of the second semiconductor substrate body. The insulating layer has a shape different from a straight-line shape in plan view.

In a more specific embodiment, the light-emitting-element mount substrate may further include an electrostatic-destruction prevention layer provided on the first major surface of the first semiconductor substrate body.

In a further more specific embodiment of the light-emitting-element mount substrate including an electrostatic-destruction prevention layer, the second surface mounting electrode may be preferably provided to reach the first major surface of the first semiconductor substrate body, and the electrostatic-destruction prevention layer may be preferably provided between the second surface mounting electrode and the first major surface of the first semiconductor substrate body so that the electrostatic-destruction prevention layer is entirely superposed on the second surface mounting electrode in plan view.

In another more specific embodiment of the light-emitting-element mount substrate, the electrostatic-destruction prevention layer may be preferably a semiconductor layer including multiple carriers having a reversed polarity with respect to a polarity of the substrate body.

In yet another more specific embodiment of a light-emitting-element mount substrate including an electrostatic-destruction prevention layer, the electrostatic-destruction prevention layer may be preferably a varistor layer.

In still another more specific embodiment of a light-emitting-element mount substrate including an electrostatic-destruction prevention layer, the electrostatic-destruction prevention layer may be preferably a low-density semiconductor layer including a low-density carrier having a polarity being the same as a polarity of the substrate body and having a density lower than a density of the substrate body.

In another more specific embodiment, the light-emitting-element mount substrate may preferably further include a side-surface insulating layer provided on an outer side surface of the substrate body.

In another more specific embodiment, the light-emitting-element mount substrate may further include a barrier layer provided between the substrate body and the first and second surface mounting electrodes, the barrier layer preventing diffusion of metal that forms the first and second surface mounting electrodes.

Also, in yet another more specific embodiment, the light-emitting-element mount substrate may further include a first surface insulating layer provided on a major surface of the substrate body, at least a part of the first and second surface mounting electrodes being a non-formation region of the surface insulating layer.

Also, another more specific embodiment of a light-emitting-element mount substrate of the present disclosure may further include a second surface insulating layer provided on a second major surface of the substrate body, at least a part of the first and second external-connection electrodes being a non-formation region of the second surface insulating layer.

Another aspect of the disclosure is an LED device including the above-described light-emitting-element mount substrate, and a light emitting element having an anode electrode and a cathode electrode that are respectively connected with the first and second surface mounting electrodes.

In another aspect of the present disclosure, a light-emitting-element mount substrate used for connecting a plurality of light emitting elements with an external circuit board includes a substrate body including a low-resistance semiconductor substrate and an insulating layer that divides the substrate body into at least a first semiconductor substrate body, a second semiconductor substrate body, and a third semiconductor substrate body, which are insulated from each other. The light-emitting-element mount substrate includes a first surface mounting electrode provided on a first major surface of the first semiconductor substrate body, a first external-connection electrode provided on a second major surface of the first semiconductor substrate body, a second surface mounting electrode provided on a first major surface of the second semiconductor substrate body, a second external-connection electrode provided on a second major surface of the second semiconductor substrate body; a common surface mounting electrode provided on a first major surface of the third semiconductor substrate body, and a common external-connection electrode provided on a second major surface of the third semiconductor substrate body. Also, with the light-emitting-element mount substrate of the present disclosure, a part of the insulating layer dividing the substrate body into the first to third semiconductor substrate bodies has a shape different from a straight-line shape in plan view.

The above light-emitting-element mount substrate may further preferably include a first electrostatic-destruction prevention layer provided on the first major surface of the first semiconductor substrate body and connected with the common surface mounting electrode; and a second electrostatic-destruction prevention layer provided on the first major surface of the second semiconductor substrate body and connected with the common front-surface mounting electrode.

In another more specific embodiment, the light-emitting-element mount substrate may preferably further include a side-surface insulating layer provided on an outer side surface of the substrate body.

In another more specific embodiment, the invention provides an LED device including the above-described light-emitting-element mount substrate; and a plurality of light emitting elements each having a first terminal connected with the common front-surface mounting electrode and a second terminal connected with corresponding one of the front-surface mounting electrodes other than the common front-surface mounting electrode.

DETAILED DESCRIPTION

Figure 1:
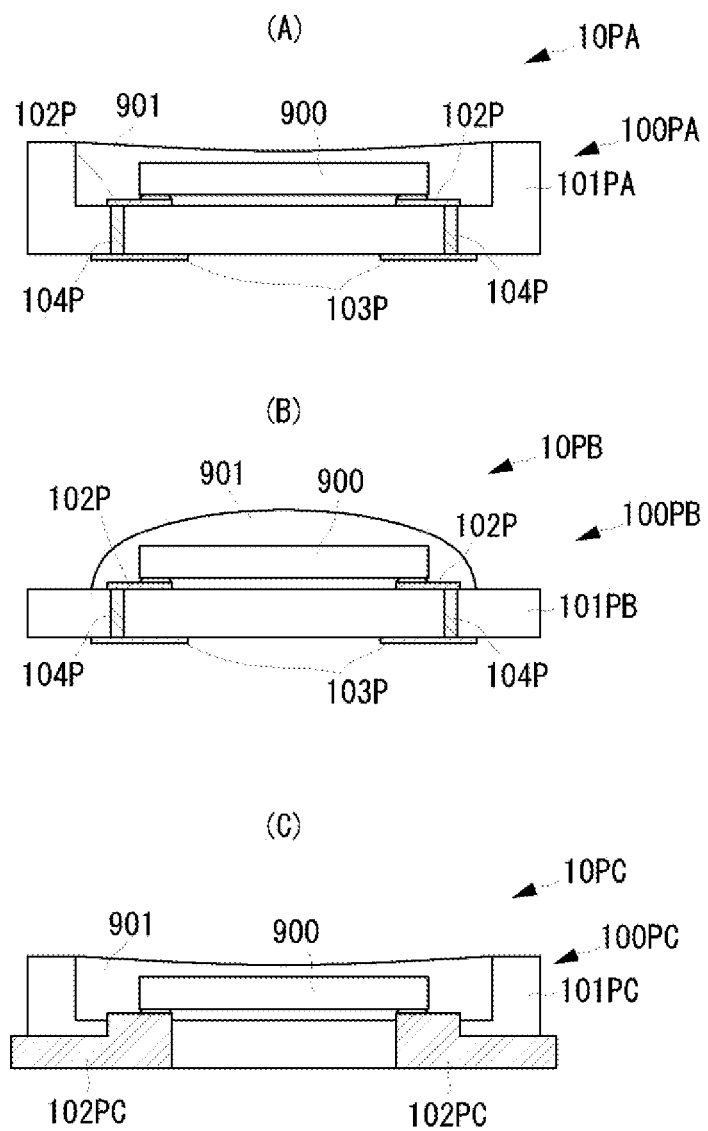
FIG. 1 provides side sectional views showing representative structure examples of conventional LED devices.

The inventors realized that in the LED device descried in Patent Document 1, because the silicon oxide layer has a lower mechanical strength than that of the silicon, separation etc. may likely occur at the interface between the silicon and the silicon oxide layer, and hence, reliability is degraded. Also, if a high-resistance silicon substrate is used for the substrate body of the light-emitting-element mount substrate, via electrodes for connecting the mounting electrodes, which mount the light emitting element, with external-connection electrodes, which mount the LED device on an external circuit board, have to be provided. The manufacturing process may be increased in the number of steps and the manufacturing cost may be increased.

Also, if the ESD protection element is formed in the semiconductor substrate being the substrate body of the light-emitting-element mount substrate, as described in Patent Document 2, pn junction has to be formed in the semiconductor substrate. The forming process of the substrate body may be increased in the number of steps and the manufacturing cost may be increased.

An LED device and a light-emitting-element mount substrate used for the LED device according to a first exemplary embodiment that can address the above shortcomings are described with reference to the drawings.

FIG. 2(A) is a plan view of a top surface and FIG. 2(B) is a plan view of a bottom surface of an LED device 10 according to the first exemplary embodiment. FIG. 2(C) is an A-A sectional view of FIGS. 2(A) and 2(B), and FIG. 2(D) is a B-B sectional view of FIGS. 2(A) and 2(B).

The LED device 10 includes a light emitting element 900 that is an LED element, and a light-emitting-element mount substrate 100. The light emitting element 900 includes an anode terminal and a cathode terminal (not shown). The anode terminal and the cathode terminal are provided at both opposite ends of a casing of the light emitting element 900.

The light-emitting-element mount substrate 100 includes a substrate body 101 formed of a low-resistance n-type silicon substrate. The substrate body 101 has a resistivity of about 0.001 Ω·cm. The substrate body 101 includes a first individual substrate body 111 and a second individual substrate body 112 that are isolated by an insulating layer 105. That is, substrate body 101 includes the insulating layer 105 that divides the substrate body 101 into a first semiconductor substrate body 111 and a second semiconductor substrate body 112 such that the second semiconductor substrate body 112 is insulated from the first semiconductor body 111.

The insulating layer 105 is a layer having an insulating property and mainly made of $SiO_2$. The insulating layer 105 has a continuous shape from a top surface to a bottom surface of the substrate body 101, the shape which is continued from a first side surface (an upper side surface in FIG. 2(A)) to a second side surface (a lower side surface in FIG. 2(A)) at a side opposite to the first side surface.

In plan view, the insulating layer 105 has a shape in which a part having a shape extending in the direction of the normal to the first side surface and the second side surface and a part having a shape not being parallel to the part having the shape extending in the direction of the normal but extending in a direction at a predetermined angle to the direction of the normal are alternately continued. Hence, the insulating layer 105 does not have a simple straight-line shape (a first-dimensional shape) but has a shape with a plurality of bending parts (a two-dimensional shape extending in a plurality of directions) in plan view.

With this shape, the first individual substrate body 111 and the second individual substrate body 112 have shapes in which protrusions and recesses are repeated at mutually facing sides in plan view (e.g., in a dovetail manner). The protrusion of the first individual substrate body 111 is fitted to the recess of the second individual substrate body 112. The protrusion of the second individual substrate body 112 is fitted to the recess of the first individual substrate body 111.

The insulating layer 105 may have a width (a width in plan view) that is properly determined to prevent a leak from occurring between the first individual substrate body 111 and the second individual substrate body 112 with current and voltage to be applied to the light emitting element 900.

Since the insulating layer 105 has this shape, when a mechanical stress, such as bending or pulling, is applied to the light-emitting-element mount substrate 100, the stress applied to the insulating layer 105 becomes a compressive stress. Hence, the insulating layer 105 can be prevented from being broken, and from being ruptured at the interface between the insulating layer 105 and the first individual substrate body 111 and at the interface between the insulating layer 105 and the second individual substrate body 112. Accordingly, the mechanical strength of the light-emitting-element mount substrate 100 can be increased.

A mounting electrode 102A having a predetermined pattern (in FIG. 2, a rectangular pattern in plan view) is provided on a front surface, i.e., a first major surface of the first individual substrate body 111. A barrier layer 120A is provided between the first individual substrate body 111 and the mounting electrode 102A. The barrier layer 120A is made of a metal that is made of, for example, Ti, and that hardly diffuses heat.

A first external-connection electrode 103A having a predetermined pattern (in FIG. 2, a rectangular pattern in plan view) is provided on a back surface, i.e., a second major surface opposite the first major surface of the first individual substrate body 111, at a side opposite to the mounting electrode 102A.

Since the mounting electrode 102A and the first external-connection electrode 103A are provided on the front and back surfaces of the first individual substrate body 111 made of the low-resistance n-type silicon substrate, these electrodes can be electrically connected with each other without a via electrode or the like be provided in the substrate body.

A mounting electrode 102B having a predetermined pattern (in FIG. 2, a rectangular pattern in plan view) is provided on a front surface of the second individual substrate body 112. A barrier layer 120B is provided between the second individual substrate body 112 and the mounting electrode 102B. The barrier layer 120B is made of a metal that is made of, for example, Ti, and that hardly diffuses heat.

A second external-connection electrode 103B having a predetermined pattern (in FIG. 2, a rectangular pattern in plan view) is provided on a back surface of the second individual substrate body 112, at a side opposite to the mounting electrode 102B.

Since the mounting electrode 102B and the second external-connection electrode 103B are provided on the front and back surfaces of the second individual substrate body 112 made of the low-resistance n-type silicon substrate, these electrodes can be electrically connected with each other without a via electrode or the like provided in the substrate body.

A p-type silicon layer 106 is provided on the front surface of the first individual substrate body 111. The p-type silicon layer 106 is a semiconductor layer having many carriers with a reversed polarity with respect to the polarity of the substrate body 101. Since the p-type silicon layer 106 is arranged on the front surface of the first individual substrate body 111 made of the low-resistance n-type silicon substrate, pn junction can be formed by the first individual substrate body 111 and the p-type silicon layer 106. Since the pn junction is formed, this portion can function as a diode. Hence, although described later, if the p-type silicon layer 106 is electrically connected with a wiring electrode pattern that is provided at the second individual substrate body 112 and is electrically connected with the light emitting element 900, the p-type silicon layer 106 can be used as an electrostatic-destruction prevention layer or an ESD protection layer for the light emitting element 900.

An insulating layer 107T being a front-surface insulating layer is provided on the entire front surface of the substrate body 101, except a region in which the above-described mounting electrodes 102A and 102B and p-type silicon layer 106 are provided.

An insulating layer 107B being a back-surface insulating layer is provided on the entire back surface of the substrate body 101, except a region in which the above-described first and second external-connection electrodes 103A and 103B are provided. Since the insulating layer 107B is provided on the back surface of the substrate body 101, when the light-emitting-element mount substrate 100 is mounted on an external circuit board (not shown), the first individual substrate body 111 and the second individual substrate body 112 can be prevented from being short-circuited because of solder or the like. Accordingly, the reliable light-emitting-element mount substrate 100 can be provided.

Figure 2:
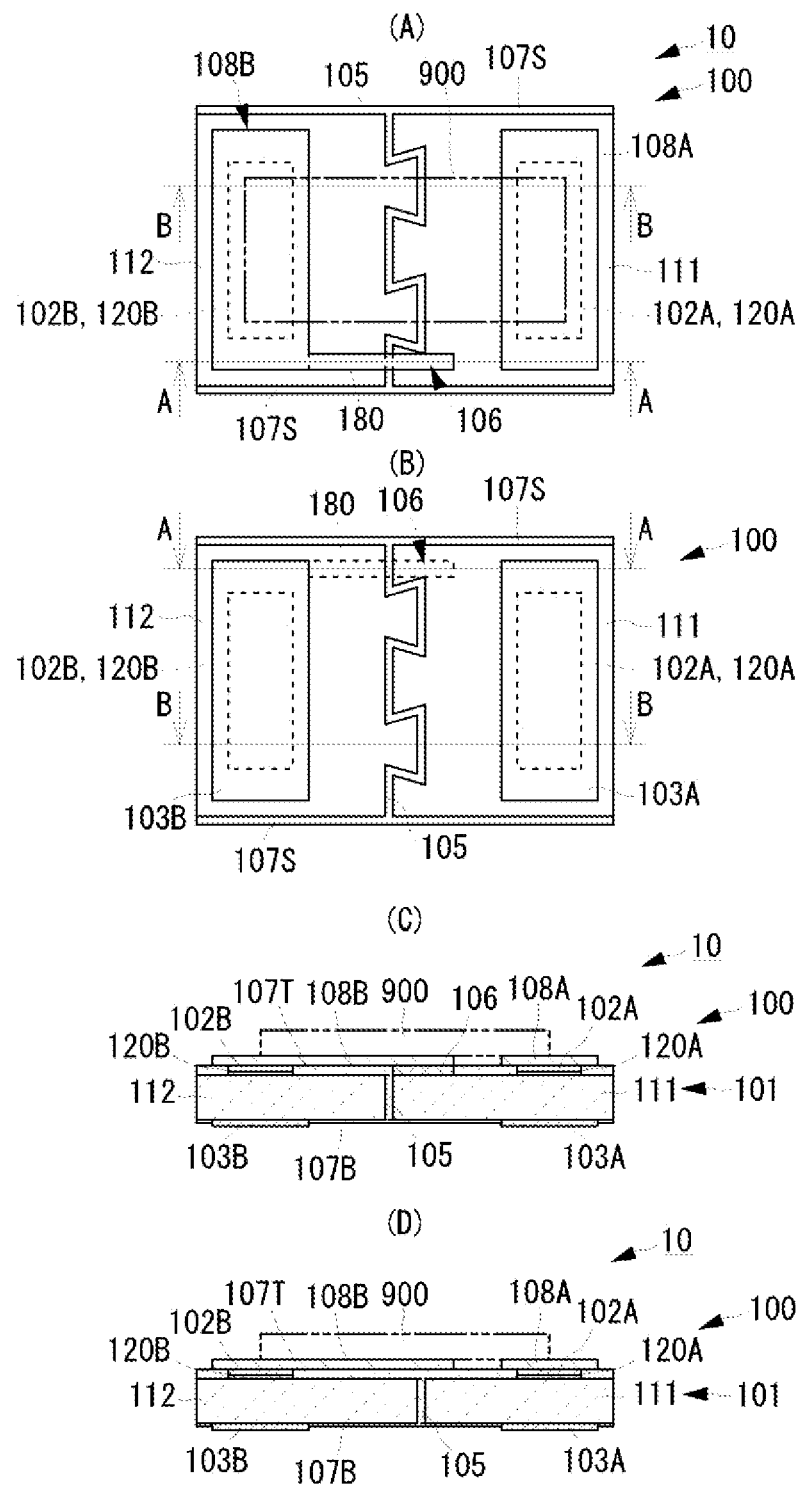
FIG. 2 provides a plan view of a top surface, a plan view of a bottom surface, an A-A sectional view, and a B-B sectional view of an LED device 10 according to a first exemplary embodiment.

Insulating layers 107S being side-surface insulating layers are provided on the above-described first and second side surfaces of the substrate body 101. Hence, even if condensation occurs and adheres to the side surfaces of the light-emitting-element mount substrate 100, the first individual substrate body 111 and the second individual substrate body 112 can be prevented from being short-circuited. Also with this configuration, the reliable light-emitting-element mount substrate 100 can be provided. In FIG. 2, the insulating layers 107S are provided on the entire first and second side surfaces. However, an insulating layer may be provided in a predetermined area to cover a portion from which the insulating layer 105 is exposed. However, if the insulating layers 107S are provided on the entire first and second side surfaces, the more reliable light-emitting-element mount substrate 100 can be provided.

A first front-surface mounting electrode 108A, which is electrically connected with the mounting electrode 102A, and a second front-surface mounting electrode 108B, which is electrically connected with the mounting electrode 102B, are provided on the front surface of the light-emitting-element mount substrate 100, at a portion provided with the mounting electrodes 102A and 102B, the p-type silicon layer 106, and the insulating layer 107T.

The first front-surface mounting electrode 108A is mainly provided on the mounting electrode 102A, and is provided within the region of the first individual substrate body 111 in plan view.

The second front-surface mounting electrode 108B is mainly provided on the mounting electrode 102B, and is provided within the region of the second individual substrate body 112 in plan view. The second front-surface mounting electrode 108B includes an ESD-connection electrode 180. The ESD-connection electrode 180 is provided to be electrically connected with the p-type silicon layer 106.

One terminal (for example, the anode terminal) of the light emitting element 900 is connected with the first front-surface mounting electrode 108A, and the other terminal (for example, the cathode terminal) of the light emitting element 900 is connected with the second front-surface mounting electrode 108B. Accordingly, current that is applied from the external circuit board to the light-emitting-element mount substrate 100 is supplied to the light emitting element 900, and the light emitting element 900 is lit.

With the configuration of this embodiment, although a via electrode is not provided at the light-emitting-element mount substrate, current can be supplied from the external circuit board to the light emitting element, and the manufacturing process of the LED device can be simplified. Further, since the low-resistance n-type silicon substrate is used for the substrate body of the light-emitting-element mount substrate, thermal conductivity can be increased. For example, a silicon semiconductor substrate typically has a thermal conductivity of 148 W/mK, and an alumina substrate, which is a conventional insulating ceramic substrate, has a thermal conductivity of 32 W/mK. Hence, the thermal conductivity of the silicon semiconductor substrate can be higher than the thermal conductivity of the conventional alumina substrate. Hence, heat generated through emission of light from the light emitting element (the LED element) can be efficiently released to the external circuit board. Accordingly, even if the light emitting element is a high-output type, the light emitting element can be prevented form being deteriorated because of the heat of the light emitting element, and the life of the light emitting element can become long.

Also, since the structure of the insulating layer according to this embodiment is used, the light-emitting-element mount substrate having a high mechanical strength can be provided as described above. Accordingly, even if energization and non-energization of the light emitting element (the LED element) are repeated and hence heating and cooling occur at the light emitting element and the light-emitting-element mount substrate, a stress that is applied to the light emitting element because of the difference between expansion coefficients of the light emitting element and the light-emitting-element mount substrate can be reduced. Accordingly, reliability of the LED device can be increased.

Further, with the configuration of this embodiment, since the ESD protection function is provided, the light emitting element can be protected from static electricity. Further, since the layer having the ESD protection function is not provided in the semiconductor substrate (the substrate body) but is provided on the front surface, the manufacturing process can be simplified.

Further, with the configuration of this embodiment, since the insulating layer is provided on the outer surface of the substrate body made of the low-resistance n-type silicon substrate, the first individual substrate body and the second individual substrate body forming the substrate body can be prevented form being short-circuited because of an external factor (for example, a short circuit caused by solder during mounting or condensation). With this configuration, the highly reliable LED device can be provided.

Also, with the configuration of this embodiment, since the barrier layer is provided, the metal forming the mounting electrodes can be prevented from being diffused to the first individual substrate body and the second individual substrate body due to the heat caused by the emission of light from the light emitting element. With this configuration, the highly reliable LED device can be provided.

Although a specific configuration is not described above, the second front-surface mounting electrode 108B has a shape that is superposed on the entire surface of the p-type silicon layer 106, or in other words, a shape that covers the p-type silicon layer 106 in plan view. With this shape, the p-type silicon layer 106 can be prevented from being irradiated with the light emitted from the light emitting element 900 or light of the external environment. Hence, the characteristics of the p-type silicon layer 106 can be prevented from being degraded because of light. Also, the solder for mounting the light emitting element 900 can be prevented from adhering to the p-type silicon layer 106. With this configuration, the highly reliable LED device can be provided.

Figure 3:
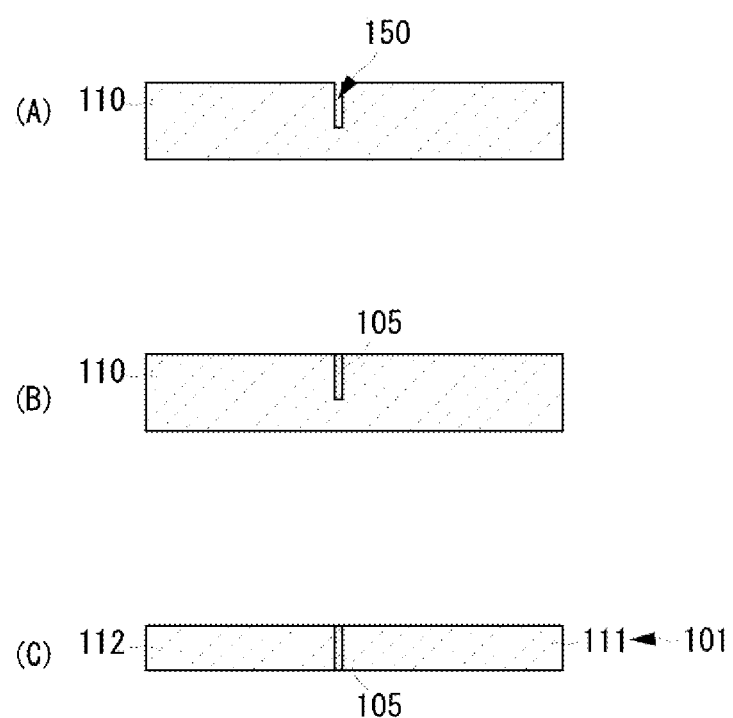
FIG. 3 provides side sectional views of the A-A section for explaining a manufacturing process (a first half) of a light-emitting-element mount substrate 100 of the LED device 10 according to the first embodiment.
Figure 4:
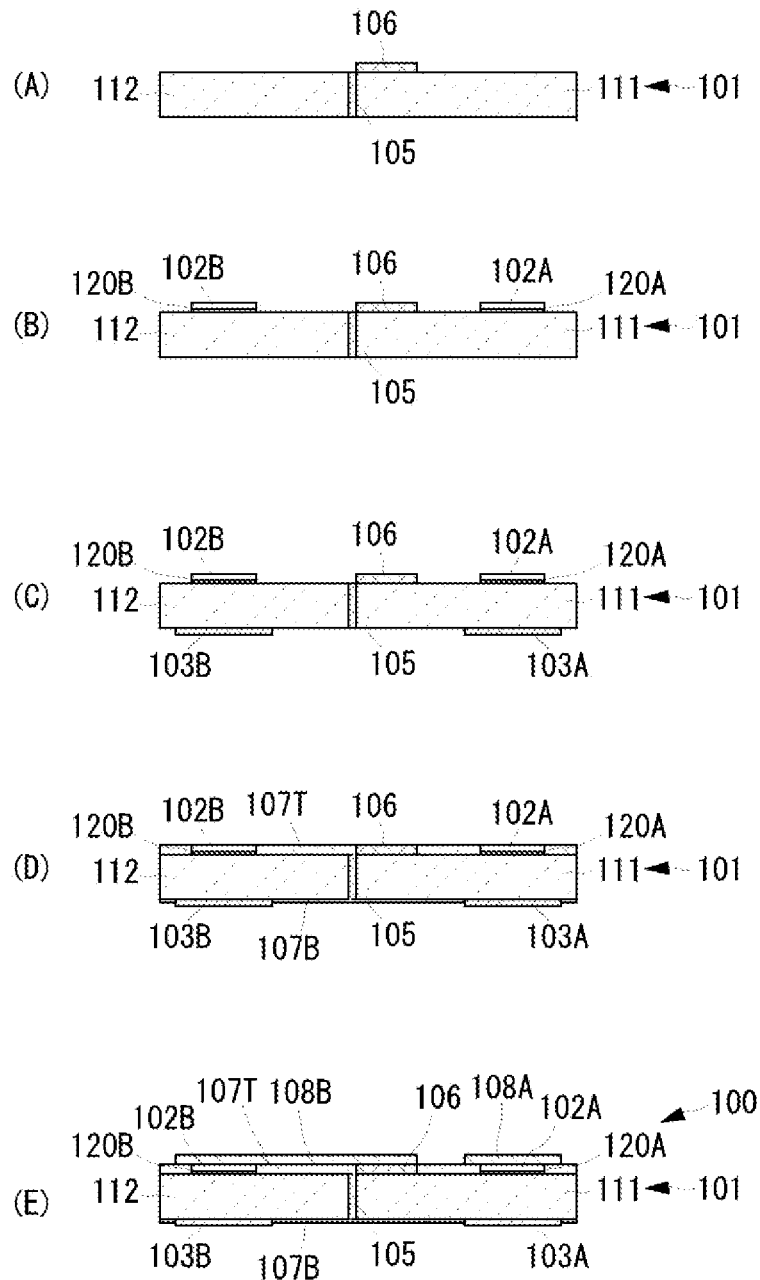
FIG. 4 provides side sectional views of the A-A section for explaining the manufacturing process (a latter half) of the light-emitting-element mount substrate 100 of the LED device 10 according to the first embodiment.

The light-emitting-element mount substrate 100 with the above-described configuration is manufactured by the following manufacturing process. FIGS. 3 and 4 provide side sectional views of the A-A section for explaining the manufacturing process of the light-emitting-element mount substrate 100 of the LED device 10 according to this embodiment.

First, as shown in FIG. 3(A), a base substrate body 110 that is a low-resistance n-type silicon substrate having a larger thickness than a height of the insulating layer 105 is prepared, and a groove 150 having a larger depth than the height of the insulating layer 105 to be formed is formed by RIE (reactive ion etching) etc. At this time, the base substrate body 110 preferably has a thickness that is larger than the twice the thickness (the height) of the insulating layer 105 to be formed. With this configuration, the strength of the base substrate body 110 can be ensured when the groove 150 is formed. At this time, a groove (not shown) for forming the insulating layer 107S on the side surface is also formed.

Then, as shown in FIG. 3(B), to form the insulating layer 105, the groove 150 is filled with an insulating material by a method such as thermal oxidation or plasma CVD. Specifically, $SiO_2$, $SiN_x$, and polysilicon are used as the principal materials for the insulating material. If the insulating layer 105 has a large width, molten glass may be poured into the groove 150. At this time, the groove for forming the insulating layer 107S at the side surface is also filled with the insulating material.

Then, as shown in FIG. 3(C), the front surface and the back surface of the base substrate body 110 are ground, and the insulating layer 105 is exposed at both the front surface and the back surface (i.e., the first and second major surfaces). Also, the base substrate body 110 is ground so that the insulating layer 107S is exposed from the side surface. Hence, the substrate body 101 is formed.

Then, as shown in FIG. 4(A), the p-type silicon layer (an epitaxial layer) 106 is formed on the front surface of the substrate body 101 by CVD etc. Alternatively, the p-type silicon layer 106 may be formed by growing p-type polysilicon. The thickness and width of the p-type silicon layer 106 are determined to have dimensions that can sufficiently provide the ESD protection function for the light emitting element 900.

Then, as shown in FIG. 4(B), the barrier layers 120A and 120B are formed on the front surface of the substrate body 101 by sputtering or deposition. The barrier layers 120A and 120B uses a material that hardly diffuses heat as described above and that likely forms good ohmic junction for the low-resistance n-type silicon substrate.

The mounting electrodes 102A and 102B are formed on front surfaces of the formed barrier layers 120A and 120B by PVD or plating. The mounting electrodes 102A and 102B may each preferably use a Cu (copper) layer having a predetermined thickness. Accordingly, solder leaching etc. during mounting of the light emitting element 900 is prevented, the light emitting element 900 is hardly influenced by an external factor such as oxidation, and the mounting electrodes 102A and 102B can be formed of a relatively inexpensive material.

Then, as shown in FIG. 4(C), the first and second external-connection electrodes 103A and 103B made of a metal material such as Cu are formed on the back surface of the substrate body 101. The first and second external-connection electrodes 103A and 103B may be formed by, for example, a method similar to that of the mounting electrodes 102A and 102B.

Then, as shown in FIG. 4(D), the insulating layer 107T is formed on the entire front surface of the substrate body 101 except the formation region of the mounting electrodes 102A and 102B, and the p-type silicon layer 106. Similarly, the insulating layer 107B is formed on the entire back surface of the substrate body 101 except the formation region of the first and second external-connection electrodes 103A and 103B. The insulating layers 107T and 107B may use polyimide.

Then, the first front-surface mounting electrode 108A and the second front-surface mounting electrode 108B are formed with predetermined patterns on the front surface on which the mounting electrodes 102A and 102B, the p-type silicon layer 106, and the insulating layer 107T are formed. The first front-surface mounting electrode 108A and the second front-surface mounting electrode 108B may be each formed of a Cu (copper) layer with a thickness of about 10 μm, a Ni (nickel) plating layer on the Cu layer, and an Au (gold) plating layer on the Ni plating layer. Accordingly, solder leaching etc. during mounting of the light emitting element 900 is prevented, the light emitting element 900 is hardly influenced by an external factor such as oxidation, and the first front-surface mounting electrode 108A and the second front-surface mounting electrode 108B can be formed of a relatively inexpensive material.

The LED device 10 can be manufactured by forming light-emitting-element mount substrate 100 by the above-described manufacturing process, and mounting the light emitting element 900 on the first front-surface mounting electrode 108A and the second front-surface mounting electrode 108B. The manufacturing process is merely an example. The LED device 10 can be manufactured similarly to the above-described process, even by changing the process order.

Next, an LED device according to a second exemplary embodiment is described with reference to the drawings. A light-emitting-element mount substrate 100' of the LED device according to this embodiment uses a varistor layer 106A instead of the p-type silicon layer 106 of the light-emitting-element mount substrate 100 of the LED device 10 according to the first exemplary embodiment. The varistor layer 106A is formed of a metal oxide film or a positive temperature coefficient thermistor element having varistor characteristics.

If the varistor layer 106A is used, the varistor layer 106A is provided on the insulating layer 107T provided on the front surface of the first individual substrate body 111. Since the varistor layer 106A is used, the resistance is high with a voltage lower than a predetermined voltage and the resistance is low with a voltage of the predetermined voltage or higher. Hence, the varistor layer 106A can function as the ESD protection element. Accordingly, like the above-described embodiment, the ESD protection function can be provided for the light emitting element while the ESD protection function is not provided in the substrate body.

Also, in this embodiment, an insulating layer 171T being a front-surface insulating layer is provided on the entire front surface except the first front-surface mounting electrode 108A and the second front-surface mounting electrode 108B. Since the insulating layer 171T is provided on the front surface of such a light-emitting-element mount substrate 100', a short-circuit can be prevented from occurring because of solder when the light emitting element 900 is mounted on the first front-surface mounting electrode 108A and the second front-surface mounting element 108B. Accordingly, the further highly reliable LED device can be provided.

Figure 5:
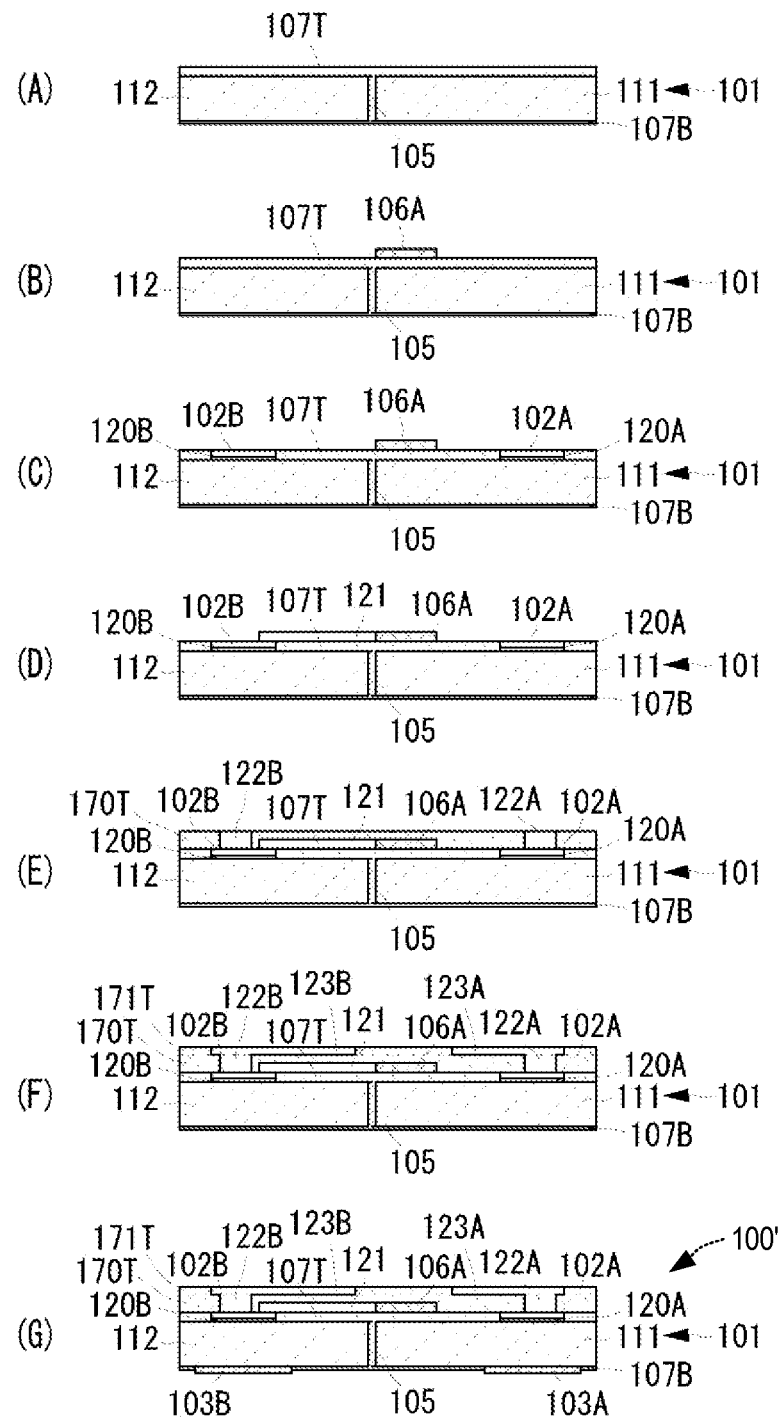
FIG. 5 provides side sectional views for explaining a manufacturing process of a light-emitting-element mount substrate 100' of an LED device according to a second exemplary embodiment.

FIG. 5 provides side sectional views for explaining a manufacturing process of the mount substrate 100' of the LED device according to this embodiment. The process to the forming step of the insulating layer 105, that is, to the completion of the substrate body 101 is equivalent to the above-described process. Hence the illustration and explanation of the part of the process are omitted.

When the substrate body 101 in which the first individual substrate body 111 and the second individual substrate body 112 are isolated by the insulating layer 105 is completed, as shown in FIG. 5(A), the insulating layers 107T and 107B are formed on the front and back surfaces of the substrate body 101 by a method similar to that of the above-described embodiment.

Then, as shown in FIG. 5(B), the varistor layer 106A is formed on the front surface of the insulating layer 107T by printing etc. Specifically, the varistor layer 106A is formed by printing paste of ZnO etc. with a predetermined pattern, and the printed paste is fired at about 1100° C.

Then, as shown in FIG. 5(C), the barrier layers 120A and 120B and the mounting electrodes 102A and 102B are formed on the front surface of the substrate body 101. At this time, for example, an opening is formed at the insulating layer 107T on the front surface of the substrate body 101 in the formation region of the mounting electrodes 102A and 102B. The barrier layers 120A and 120B and the mounting electrodes 102A and 102B are successively formed at the opening by a method similar to that of the above-described embodiment.

Then, as shown in FIG. 5(D), a connection electrode 121 that connects the mounting electrode 102B with the varistor layer 106A is formed on the front surface of the insulating layer 107T and mounting electrode 102B. The connection electrode 121 may be formed of Cu etc.

Then, as shown in FIG. 5(E), connection via electrodes 122A and 122B are formed on the mounting electrodes 102A and 102B, and an insulating layer 170T is formed on the entire surface except the connection via electrodes 122A and 122B.

Then, as shown in FIG. 5(F), front-surface electrodes 123A and 123B that have predetermined patterns and are respectively connected with the connection via electrodes 122A and 122B are formed, and the insulating layer 171T is formed on the entire surface except the front-surface electrodes 123A and 123B. Then, the terminals of the light emitting element 900 (not shown) are connected with the front-surface electrodes 123A and 123B.

Then, as shown in FIG. 5(G), openings with predetermined patterns are formed at the insulating layer 107B on the back surface of the substrate body 101, and the first and second external-connection electrodes 103A and 103B are formed at the openings.

With the configuration and the manufacturing process, the effect and advantage similar to those of the first embodiment can be obtained.

The manufacturing process shown in FIG. 5 is also merely an example, and other similar manufacturing process may be used. For example, when the mounting electrodes 102A and 102B are formed on the front surface of the substrate body 101, the first and second external-connection electrodes 103A and 103B may be formed on the back surface.

Figure 6:
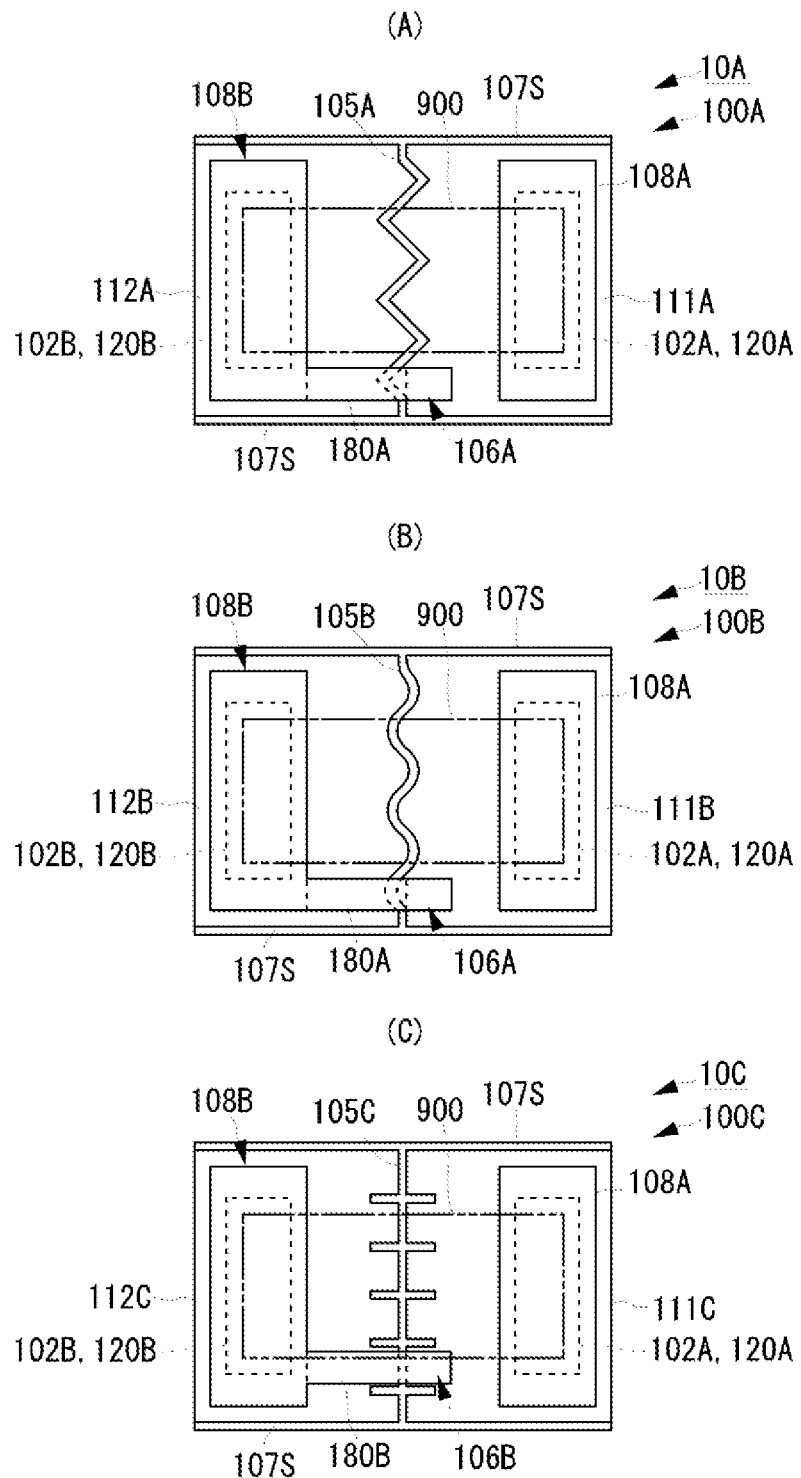
FIG. 6 provides plan views of top surfaces of LED devices 10A to 10C according to first to third exemplary modifications.

The insulating layer 105 shown in the above-described embodiments may have the following shape. FIGS. 6(A) to 6(C) are plan views of top surfaces of LED devices 10A to 10C according to first to third example modifications. The LED devices 10A to 10C shown in FIGS. 6(A) to 6(C) differ from the LED device 10 according to the first embodiment for the shape of the insulating layer, and other configuration is the same.

In a light-emitting-element mount substrate 100A of the LED device 10A shown in FIG. 6(A), an insulating layer 105A has a shape in which a first bending part bending from the first individual substrate body 111 toward the second individual substrate body 112 and a second bending part bending from the second individual substrate body 112 toward the first individual substrate body 111 are alternately repeated from the first side surface toward the second side surface in plan view. In other words, the insulating layer 105A is provided in a zigzag form in plan view.

In a light-emitting-element mount substrate 100B of the LED device 10B shown in FIG. 6(B), an insulating layer 105B has a shape in which a first curve part turning from the first individual substrate body 111 toward the second individual substrate body 112 and a second curve part turning from the second individual substrate body 112 toward the first individual substrate body 111 are alternately repeated from the first side surface toward the second side surface in plan view. In other words, the insulating layer 105B is provided in a meandering or serpentine form in plan view.

In a light-emitting-element mount substrate 100C of the LED device 10C shown in FIG. 6(C), an insulating layer 105C includes a straight-line main part extending in the direction of the normal to the first side surface and the second side surface, and a sub part extending in a direction being parallel to the first side surface and the second side surface in plan view. The sub part is orthogonal to the main part, and a plurality of the sub parts are provided along the direction in which the main part extends.

Even if the insulating layer has any of the shapes in FIGS. 6(A), 6(B), and 6(C), the mechanical strength can be increased as compared with an insulating layer having a simple straight-line shape. As described above, as long as the light-emitting-element mount substrate includes the insulating layer having the shape that is not a straight-line shape extending in the direction of the normal to the first side surface and the second side surface, but extends in a direction different from the direction of the normal in plan view, even if the insulating layer has other shape, the mechanical strength can be increased.

Figure 7:
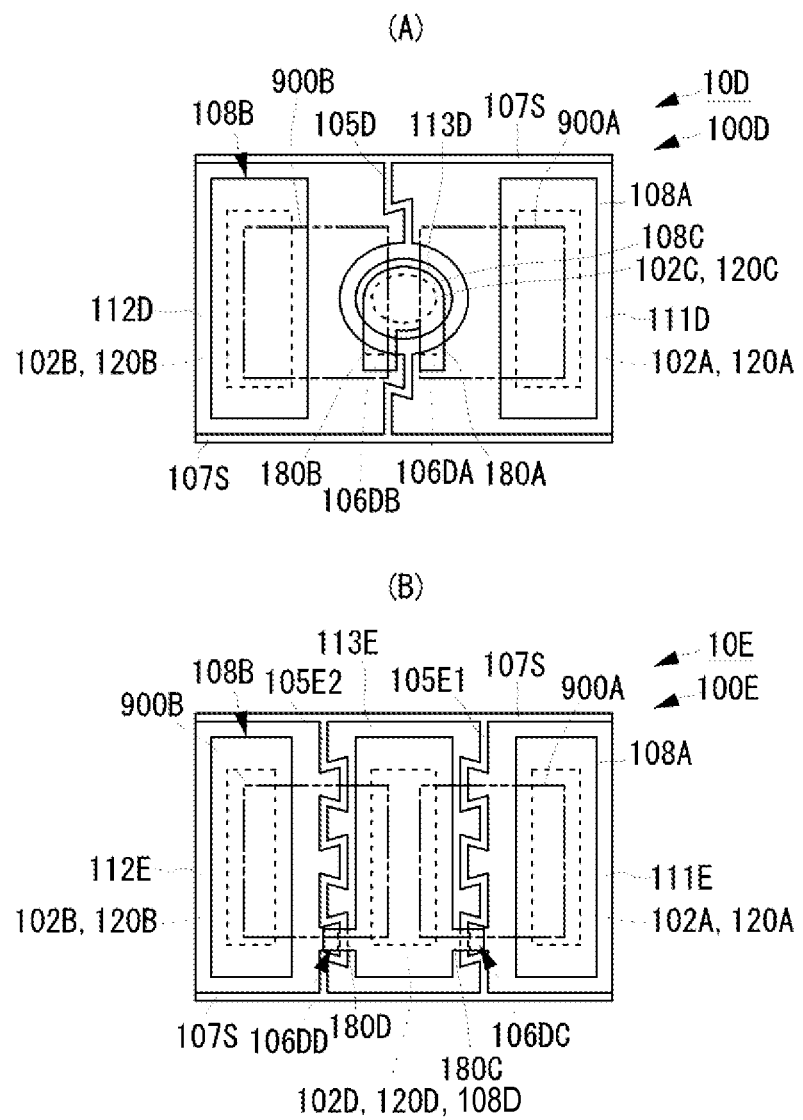
FIG. 7 provides illustrations of configuration examples of LED devices 10D and 10E according to a third exemplary embodiment, the LED devices 10D and 10E each having two light emitting elements mounted on a single light-emitting-element mount substrate.
Figure 8:
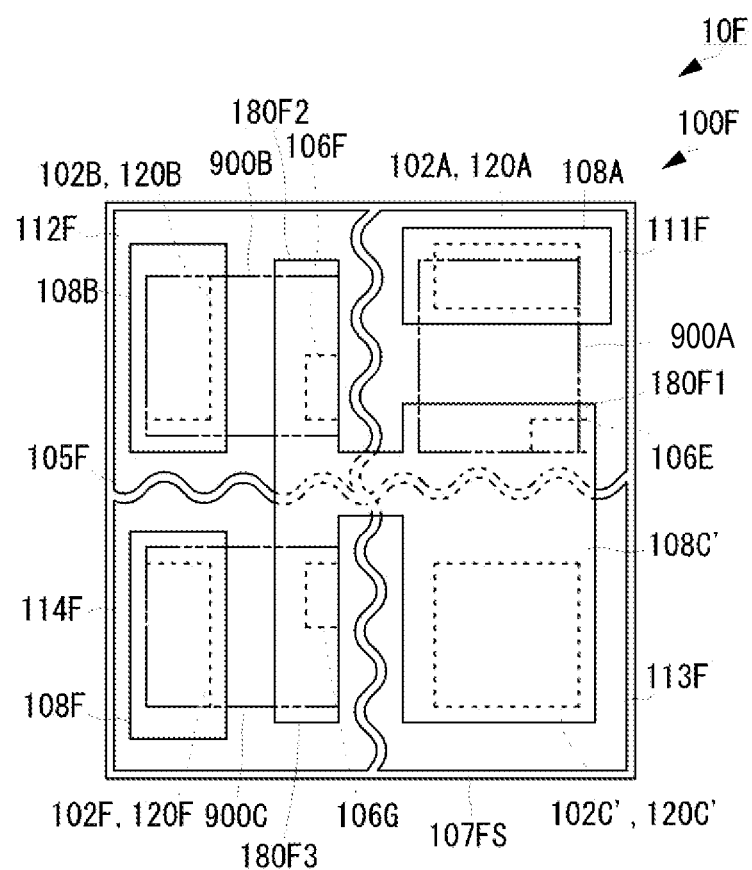
FIG. 8 is an illustration of a configuration example of an LED device 10F according to the third exemplary embodiment, the LED device 10F having three light emitting elements mounted on a single light-emitting-element mount substrate.

Next, LED devices 10D, 10E, and 10F according to a third exemplary embodiment are described with reference to the drawings. In the above-description, the single light emitting element is mounted on the light-emitting-element mount substrate. However, in this embodiment, an LED device in which a plurality of light emitting elements are mounted on a single light-emitting-element mount substrate is described. FIG. 7 provides illustrations of configuration examples of the LED devices 10D in FIGS. 7(A) and 10E in FIG. 7(B) according to the third exemplary embodiment, the LED devices 10D and 10E each having two light emitting elements mounted on a single light-emitting-element mount substrate. FIG. 8 is an illustration of a configuration example of the LED device 10F according to the third embodiment, the LED device 10F having three light emitting elements mounted on a single light-emitting-element mount substrate. FIGS. 7 and 8 are plan views in a state in which the front-surface insulating layer 107T is removed. The front-surface insulating layer 107T is provided except a region in which barrier layers 120A, 120B, 120C, 120C', 120D, and 120F, and mounting electrodes 102A, 102B, 102C, 102C', 102D, and 102F are provided. Although not shown, the external-connection electrodes and the insulating layer are provided on the back surface of each light-emitting-element mount substrate in a manner similar to the above-described embodiments.

In a light-emitting-element mount substrate 100D of the LED device 10D shown in FIG. 7(A), an insulating layer 105D is divided into two parts in the middle when extending from the first side surface toward the second side surface, and the two parts are combined and reach or extend to the second side surface. Accordingly, a first individual substrate body 111D, a second individual substrate body 112D, and a third individual substrate body 113D that is insulated from both the first and second individual substrate bodies 111D and 112D are provided by the insulating layer 105D.

A barrier layer 120C, a common mounting electrode 102C, and a common front-surface mounting electrode 108C are provided in that order on a front surface of the third individual substrate body 113D.

The common front-surface mounting electrode 108C includes ESD-connection electrodes 180A and 180B. The ESD-connection electrode 180A is electrically connected with a p-type silicon layer 106DA provided on the first individual substrate body 111D, and covers the p-type silicon layer 106DA in plan view. The ESD-connection electrode 180B is electrically connected with a p-type silicon layer 106DB provided on the second individual substrate body 112D, and covers the p-type silicon layer 106DB in plan view.

A common external-connection electrode (not shown) is provided on a back surface (second major surface) of the third individual substrate body 113D.

A light emitting element 900A is mounted on the first front-surface mounting electrode 108A and the common front-surface mounting electrode 108C. A light emitting element 900B is mounted on the second front-surface mounting electrode 108B and the common front-surface mounting electrode 108C. With this configuration, the two light emitting elements 900A and 900B can be mounted on the single light-emitting-element mount substrate 100D. The effect and advantage similar to those of the above-described embodiments can be obtained.

In a light-emitting-element mount substrate 100E of the LED device 10E shown in FIG. 7(B), insulating layers 105E1 and 105E2 are provided substantially in parallel to each other with a predetermined gap interposed therebetween. The insulating layers 105E1 and 105E2 extend from the first side surface toward the second side surface. Hence, a region arranged between the insulating layers 105E1 and 105E2 is provided as a third individual substrate body 113E that is insulated from both of a first individual substrate body 111E and a second individual substrate body 112E by the insulating layers 105E1 and 105E2.

A barrier layer 120D, a common mounting electrode 102D, and a common front-surface mounting electrode 108D are provided in that order on a front surface of the third individual substrate body 113E.

The common front-surface mounting electrode 108D includes ESD-connection electrodes 180C and 180D. The ESD-connection electrode 180C is electrically connected with a p-type silicon layer 106DC provided on the first individual substrate body 111E, and covers the p-type silicon layer 106DC in plan view. The ESD-connection electrode 180D is electrically connected with a p-type silicon layer 106DD provided on the second individual substrate body 112E, and covers the p-type silicon layer 106DD in plan view.

A common external-connection electrode (not shown) is provided on a back surface (second major surface) of the third individual substrate body 113E.

A light emitting element 900A is mounted on the first front-surface mounting electrode 108A and the common front-surface mounting electrode 108D. A light emitting element 900B is mounted on the second front-surface mounting electrode 108B and the common front-surface mounting electrode 108D. With this configuration, the two light emitting elements 900A and 900B can be mounted on the single light-emitting-element mount substrate 100E. The effect and advantage similar to those of the above-described embodiments can be obtained.

In a light-emitting-element mount substrate 100F of the LED device 10F shown in FIG. 8, the substrate body is divided into four parts of a first individual substrate body 111F, a second individual substrate body 112F, a third individual substrate body 113F, and a fourth individual substrate body 114F, by an insulating layer 105F including four curve parts extending from the substantially center position to the side surfaces in plan view.

A barrier layer 120A, a mounting electrode 102A, and a first front-surface mounting electrode 108A are provided in that order on the first individual substrate body 111F. A barrier layer 120B, a mounting electrode 102B, and a second front-surface mounting electrode 108B are provided in that order on the second individual substrate body 112F.

A barrier layer 120C', a common mounting electrode 102C', and a common front-surface mounting electrode 108C' are provided in that order on the third individual substrate body 113F.

A barrier layer 120F, a mounting electrode 102F, and a fourth front-surface mounting electrode 108F are provided in that order on the fourth individual substrate body 114F.

The common front-surface mounting electrode 108C' includes ESD-connection electrodes 180F1, 180F2, and 180F3. The ESD-connection electrode 180F1 is electrically connected with a p-type silicon layer 106E provided on the first individual substrate body 111F, covers the p-type silicon layer 106E in plan view, and has an area that allows a light emitting element 900A to be mounted. The ESD-connection electrode 180F2 is electrically connected with a p-type silicon layer 106F provided on the second individual substrate body 112F, covers the p-type silicon layer 106F in plan view, and has an area that allows a light emitting element 900B to be mounted.

The ESD-connection electrode 180F3 is electrically connected with a p-type silicon layer 106G provided on the fourth individual substrate body 114F, covers the p-type silicon layer 106G in plan view, and has an area that allows a light emitting element 900C to be mounted.

The light emitting element 900A is mounted on the first front-surface mounting electrode 108A and the ESD-connection electrode 180F1 of the common front-surface mounting electrode 108C'. The light emitting element 900B is mounted on the second front-surface mounting electrode 108B and the ESD-connection electrode 180F2 of the common front-surface mounting electrode 108C'. The light emitting element 900C is mounted on the fourth front-surface mounting electrode 108F and the ESD-connection electrode 180F3 of the common front-surface mounting electrode 108C'. With this configuration, the three light emitting elements 900A, 900B, and 900C can be mounted on the single light-emitting-element mount substrate 100F. The effect and advantage similar to those of the above-described embodiments can be obtained.

Also, with the LED device 10F in FIG. 8, an insulating layer 107FS being a side-surface insulating layer is provided on the entire side surfaces of the light-emitting-element mount substrate 100F. Accordingly, the highly reliable light-emitting-element mount substrate can be provided like the above-described embodiments.

Also, as shown in this embodiment, since the plurality of light emitting elements are mounted on the single light-emitting-element mount substrate and the one ends of the light emitting elements are connected with the electrodes of the common individual substrate body, the size can be reduced as compared with a case in which light emitting elements are respectively provided on light-emitting-element mount substrates.

In the above description, the pn junction or the varistor layer provides the ESD protection function. Alternatively, a low-density semiconductor layer being an n-type silicon layer made of a carrier with a lower density than that of a substrate body may be formed on a front surface of the substrate body made of an n-type silicon substrate, and thus a Schottky barrier diode may be formed. Further alternatively, a PIN diode can provide the ESD protection function. Also, such a structure with the ESD protection function may be formed on a front surface of a substrate body.

In embodiments consistent with the present disclosure, one terminal of the light emitting element can be connected with the first front-surface mounting electrode, and the other terminal of the light emitting element can be connected with the second front-surface mounting electrode. Since the substrate body is made of the low-resistance semiconductor substrate, the first front-surface mounting electrode and the first external-connection electrode formed on the first individual substrate body are electrically connected with each other, and the second front-surface mounting electrode and the second external-connection electrode formed on the second individual substrate body are electrically connected with each other. Since the first individual substrate body and the second individual substrate body are insulated from each other by the insulating layer, the first front-surface mounting electrode and the second front-surface mounting electrode are not electrically connected. Hence, an electric signal may be transmitted with a low loss through a path including the first external-connection electrode, the first individual substrate body, the first front-surface mounting electrode, the light emitting element, the second front-surface mounting electrode, the second individual substrate body, and the second external-connection electrode. Further, since the substrate body uses the semiconductor substrate, a heat release property is high. Further, since the insulating layer does not have a straight-line shape, but has a shape in which individual parts extending in a plurality of non-parallel directions are continuously connected, even if a stress, such as pulling or bending, is applied to the light-emitting-element mount substrate, the stress applied to the insulating layer becomes a compressive stress. Accordingly, a rupture can be prevented from occurring at the insulating layer or the interface between the insulating layer and the first and second individual substrate bodies.

In embodiments in which the light-emitting-element mount substrate of the invention includes an electrostatic-destruction prevention layer provided on the first major surface of the first semiconductor substrate body, since the electrostatic-destruction prevention layer is provided, the light-emitting-element mount substrate has an ESD protection function. Further, with this configuration, since the electrostatic-destruction prevention layer is provided on the front surface of the first individual substrate body, the electrostatic-destruction prevention layer can be manufactured by an easier manufacturing process than a conventional process of forming an electrostatic-destruction prevention layer in a substrate body.

In embodiments of the light-emitting-element mount substrate including an electrostatic-destruction prevention layer, and where the second surface mounting electrode is provided to reach the first major surface (e.g., front surface) of the first semiconductor substrate body, and the electrostatic-destruction prevention layer is provided between the second surface mounting electrode and the first major surface of the first semiconductor substrate body so that the electrostatic-destruction prevention layer is entirely superposed on the second surface mounting electrode in plan view, the electrostatic-destruction prevention layer can be protected from an external environment. Accordingly, ESD characteristics of the electrostatic-destruction prevention layer can be prevented from being degraded because of the external environment (for example, continuous irradiation with light).

In embodiments of the light-emitting-element mount substrate including an electrostatic-destruction prevention layer, the electrostatic-destruction prevention layer can be a semiconductor layer including multiple carriers having a reversed polarity with respect to a polarity of the substrate body. This configuration provides an example of the electrostatic-destruction prevention layer. For example, if an n-type silicon substrate is used as the semiconductor substrate, a p-type silicon layer is formed as the electrostatic-destruction prevention layer. Accordingly, pn junction is provided at the interface between the electrostatic-destruction prevention layer and the semiconductor substrate, and the pn junction functions as an ESD protection element.

In embodiments of the light-emitting-element mount substrate including an electrostatic-destruction prevention layer, the electrostatic-destruction prevention layer can be preferably a varistor layer. This configuration provides an example of the electrostatic-destruction prevention layer. The varistor layer may be formed of a metal oxide film or a positive temperature coefficient thermistor element having varistor characteristics that provide a high resistance when a voltage is a predetermined voltage or lower and a low resistance when the voltage is higher than the predetermined voltage. Even with this configuration, the ESD protection element can be provided.

In embodiments of the light-emitting-element mount substrate including an electrostatic-destruction prevention layer, the electrostatic-destruction prevention layer may be preferably a low-density semiconductor layer including a low-density carrier having a polarity being the same as a polarity of the substrate body and having a density lower than a density of the substrate body. This configuration provides an example of the electrostatic-destruction prevention layer. For example, if an n-type silicon substrate is used, a low-density semiconductor layer being an n-type silicon layer with a low carrier density is formed as the electrostatic-destruction prevention layer. Accordingly, a Schottky barrier diode is provided by the electrostatic-destruction prevention layer and the substrate body, and the Schottky barrier diode functions as the ESD protection element.

In embodiments of a light-emitting-element mount substrate in which the light-emitting-element mount substrate further includes a side-surface insulating layer provided on an outer side surface of the substrate body, since the side-surface insulating layer is provided, the first individual substrate body and the second individual substrate body can be prevented from being short-circuited through the side surface of the substrate body because of condensation etc.

In embodiments of a light-emitting-element mount substrate that further include a barrier layer provided between the substrate body and the first and second surface mounting electrodes, the barrier layer preventing diffusion of metal that forms the first and second surface mounting electrodes, heat of the metal that forms the first surface mounting electrode and the second surface mounting electrode can be prevented from being diffused into the substrate body, and deterioration over time when the light emitting element is continuously used through emission of light can be prevented.

In an embodiment of the light-emitting-element mount substrate that further includes a surface insulating layer provided on a major surface of the substrate body, where at least a part of the first and second surface mounting electrodes being a non-formation region of the surface insulating layer, the insulating layer is formed on a first major surface of the substrate body except a part in which the light emitting element is electrically connected. A short circuit between the first individual substrate body and the second individual substrate body caused by an external factor such as condensation or caused by a junction member (a brazing material such as solder) when the light emitting element is mounted on a semiconductor substrate can be prevented.

Also, in an embodiment of a light-emitting-element mount substrate according to the present disclosure which include a second surface insulating layer provided on a second major surface of the substrate body, at least a part of the first and second external-connection electrodes being a non-formation region of the second surface insulating layer, the insulating layer is formed on the second major surface of the substrate body except a part to be connected with an external circuit board. A short circuit between the first semiconductor substrate body and the second semiconductor substrate body caused by an external factor such as condensation or caused by a junction member (a brazing material such as solder) when the light-emitting-element mount substrate is mounted on the external circuit board can be prevented.

Also, in embodiments according to the present disclosure that provide an LED device including the above-described light-emitting-element mount substrate, and a light emitting element having an anode electrode and a cathode electrode that are respectively connected with the first and second front-surface mounting electrodes, since the light-emitting-element mount substrate having the above-described configuration is used, the highly reliable LED device manufactured by the simple manufacturing process can be provided.

In embodiments of the light-emitting-element mount substrate according to the present disclosure in which the insulating layer divides a low-resistance semiconductor substrate of a substrate body into more than two semiconductor substrate bodies that are insulated from one another, the above-described configuration of the light-emitting-element mount substrate that connects the single light emitting element with the external circuit board is applied to the light-emitting-element mount substrate that connects the plurality of light emitting elements to the external circuit board. As described above, even with the light-emitting-element mount substrate on which the plurality of light emitting elements are mounted, a rupture can be prevented from occurring at the insulating layer or the interface between the insulating layer and the first and second individual substrate bodies, like the light-emitting-element mount substrate on which the single light emitting element is mounted.

In embodiments of the above light-emitting-element mount substrate that further include a first electrostatic-destruction prevention layer provided on the first major surface of the first semiconductor substrate body and connected with the common surface mounting electrode; and a second electrostatic-destruction prevention layer provided on the first major surface of the second semiconductor substrate body and connected with the common front-surface mounting electrode, electrostatic destruction of the mounted light emitting elements can be prevented, like the light-emitting-element mount substrate on which the single light emitting element is mounted.

Also, where a light-emitting-element mount substrate according to the present disclosure further includes a side-surface insulating layer provided on an outer side surface of the substrate body, the individual substrate bodies can be prevented from being short-circuited through the side surface of the substrate body because of condensation etc., like the light-emitting-element mount substrate on which the single light emitting element is mounted.

In embodiments of an LED device according to the present disclosure including the above-described light-emitting-element mount substrate, and a plurality of light emitting elements each having a first terminal connected with the common front-surface mounting electrode and a second terminal connected with corresponding one of the front-surface mounting electrodes other than the common front-surface mounting electrode, since the light-emitting-element mount substrate having the above-described configuration is used, the highly reliable LED device manufactured by the simple manufacturing process and including the plurality of light emitting elements can be provided. At this time, since the common semiconductor substrate body and the common surface mounting electrode are used, the LED device can be reduced in size.

In embodiments according to the present disclosure, the light-emitting-element mount substrate having the good heat release property and the high mechanical strength can be provided by the relatively simple manufacturing steps. Also, by using the light-emitting-element mount substrate, the highly reliable LED device can be provided.

The invention claimed is:

1. A light-emitting-element mount substrate, comprising:
a substrate body including a low-resistance semiconductor substrate and an insulating layer that divides the low-resistance semiconductor substrate into a first semiconductor substrate body and a second semiconductor substrate body, which are insulated from each other;
a first surface mounting electrode provided on a first major surface of the first semiconductor substrate body;
a first external-connection electrode provided on a second major surface of the first semiconductor substrate body;
a second surface mounting electrode provided on a first major surface of the second semiconductor substrate body; and
a second external-connection electrode provided on a second major surface of the second semiconductor substrate body,
wherein the insulating layer has a shape different from a straight-line shape in plan view.

2. The light-emitting-element mount substrate according to claim 1, further comprising an electrostatic-destruction prevention layer provided on the first major surface of the first semiconductor substrate body.

3. The light-emitting-element mount substrate according to claim 2,
wherein the second surface mounting electrode is provided to reach the first major surface of the first semiconductor substrate body, and
wherein the electrostatic-destruction prevention layer is provided between the second surface mounting electrode and the first major surface of the first semiconductor substrate body so that the electrostatic-destruction prevention layer is entirely superposed on the second surface mounting electrode in plan view.

4. The light-emitting-element mount substrate according to claim 2, wherein the electrostatic-destruction prevention layer is a semiconductor layer including multiple carriers having a reversed polarity with respect to a polarity of the substrate body.

5. The light-emitting-element mount substrate according to claim 2, wherein the electrostatic-destruction prevention layer is a varistor layer.

6. The light-emitting-element mount substrate according to claim 2, wherein the electrostatic-destruction prevention layer is a low-density semiconductor layer including a low-density carrier having a polarity being the same as a polarity of the substrate body and having a density lower than a density of the substrate body.

7. The light-emitting-element mount substrate according to claim 1, further comprising a side-surface insulating layer provided on an outer side surface of the substrate body.

8. The light-emitting-element mount substrate according to claim 1, further comprising a barrier layer provided between the substrate body and the first and second surface mounting electrodes, the barrier layer preventing diffusion of metal that forms the first and second surface mounting electrodes.

9. The light-emitting-element mount substrate according to claim 1, further comprising a first surface insulating layer provided on a first major surface of the substrate body, at least a part of the first and second surface mounting electrodes being a non-formation region of the surface insulating layer.

10. The light-emitting-element mount substrate according to claim 1, further comprising a second surface insulating layer provided on a second major surface of the substrate body, at least a part of the first and second external-connection electrodes being a non-formation region of the second surface insulating layer.

11. An LED device, comprising:
the light-emitting-element mount substrate according to claim 1; and
a light emitting element having an anode electrode and a cathode electrode that are respectively connected with the first and second surface mounting electrodes.

12. A light-emitting-element mount substrate, comprising:
a substrate body including a low-resistance semiconductor substrate and an insulating layer that divides the low-resistance semiconductor substrate into at least a first semiconductor substrate body, a second semiconductor substrate body, and a third semiconductor substrate body, which are insulated from each other;
a first surface mounting electrode provided on a first major surface of the first semiconductor substrate body;
a first external-connection electrode provided on a second major surface of the first semiconductor substrate body;
a second surface mounting electrode provided on a first major surface of the second semiconductor substrate body;
a second external-connection electrode provided on a second major surface of the second semiconductor substrate body;
a common surface mounting electrode provided on a first major surface of the third semiconductor substrate body; and
a common external-connection electrode provided on a second major surface of the third semiconductor substrate body,
wherein a part of the insulating layer dividing the substrate body into the first to third semiconductor substrate bodies has a shape different from a straight-line shape in plan view.

13. The light-emitting-element mount substrate according to claim 12, further comprising:
a first electrostatic-destruction prevention layer provided on the first major surface of the first semiconductor substrate body and connected with the common surface mounting electrode; and
a second electrostatic-destruction prevention layer provided on the first major surface of the second semiconductor substrate body and connected with the common front-surface mounting electrode.

14. The light-emitting-element mount substrate according to claim 12, further comprising a side-surface insulating layer provided on an outer side surface of the substrate body.

15. The light-emitting-element mount substrate according to claim 12, wherein the part of the insulating layer having the shape different from a straight-line shape in plan view constitutes an interface between the first and second semiconductor substrate bodies or an interface between the second and third semiconductor substrate bodies.

16. An LED device, comprising:
the light-emitting-element mount substrate according to claim 12; and
a plurality of light emitting elements, each of said light emitting elements having:
a first terminal connected with the common surface mounting electrode, and
a second terminal connected with corresponding one of the surface mounting electrodes other than the common front-surface mounting electrode.

* * * * *